(12) United States Patent
Park

(10) Patent No.: US 6,281,822 B1
(45) Date of Patent: Aug. 28, 2001

(54) PULSE DENSITY MODULATOR WITH IMPROVED PULSE DISTRIBUTION

(75) Inventor: Edwin C. Park, La Jolla, CA (US)

(73) Assignees: Dot Wireless, Inc., San Diego, CA (US); VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/322,539

(22) Filed: May 28, 1999

(51) Int. Cl.$^7$ .................................................. H03M 1/66
(52) U.S. Cl. .................... 341/144; 341/145; 341/152; 341/53
(58) Field of Search .................. 341/53, 142, 144, 341/145, 152, 156

(56) References Cited

U.S. PATENT DOCUMENTS

| | | | |
|---|---|---|---|
| 3,746,847 | 7/1973 | Maritsas | 235/152 |
| 4,006,475 | * 2/1977 | Candy et al. | 341/145 |
| 4,032,914 | * 6/1977 | Candy et al. | 341/156 |
| 4,493,046 | 1/1985 | Watanabe | 364/717 |
| 4,593,271 | * 6/1986 | Candy | 341/144 |
| 4,595,910 | * 6/1986 | Wine | 341/142 |
| 4,817,148 | 3/1989 | Lafferty et al. | 380/48 |
| 5,007,088 | 4/1991 | Ooi et al. | 380/46 |
| 5,103,459 | 4/1992 | Gilhousen et al. | 375/1 |
| 5,228,054 | 7/1993 | Rueth et al. | 375/1 |
| 5,311,176 | 5/1994 | Gurney | 341/50 |
| 5,337,338 | 8/1994 | Sutton et al. | 337/333 |
| 5,428,820 | 6/1995 | Okada et al. | 455/38.3 |
| 5,499,280 | 3/1996 | Wilson et al. | 377/108 |
| 5,532,695 | 7/1996 | Park et al. | 341/173 |
| 5,774,084 | * 6/1998 | Brombaugh et al. | 341/152 |
| 5,878,075 | 3/1999 | Frank et al. | 375/200 |
| 5,883,889 | 3/1999 | Faruque | 370/335 |

OTHER PUBLICATIONS

AK281 / CDMA / J(N)–TACS / Amps ABP—Data Sheet, Asahi Kasei Microsystems Co., Ltd., pp. 1–19 (date undetermined).

* cited by examiner

Primary Examiner—Michael Tokar
Assistant Examiner—Steven S. Paik
(74) Attorney, Agent, or Firm—Pedro P. Hernandez; W. James Brady, III; Frederick J. Telecky, Jr.

(57) ABSTRACT

A pulse density modulator generates output pulses that are optimized as to their even distribution over time. More particularly, the invention represents parallel or serial digital input signals as serial binary output signals, where the binary output pulses are evenly spaced over time to the greatest extent possible. The output signal includes a pattern that repeats during successive "cycles." The number of pulses in each cycle varies in proportion to the magnitude of the digital input signal. When a digital input signal is provided to an accumulator, the accumulator repeatedly updates a current N-bit sum value by adding the digital input signal thereto. According to this computation, the accumulator either (1) provides a first prescribed signal on a carry output if the current sum cannot be expressed in N bits, or (2) provides a different prescribed signal on the carry output if the current sum can be expressed in N bits. The carry output provides a serial binary output having $2^N$ bits in each cycle. The accumulator may be used as a digital-to-analog converter by routing the carry output to an analog filter. Alternatively, the digital output of the accumulator may be used to provide a trigger signal of repeating, evenly spaced pulses.

24 Claims, 7 Drawing Sheets

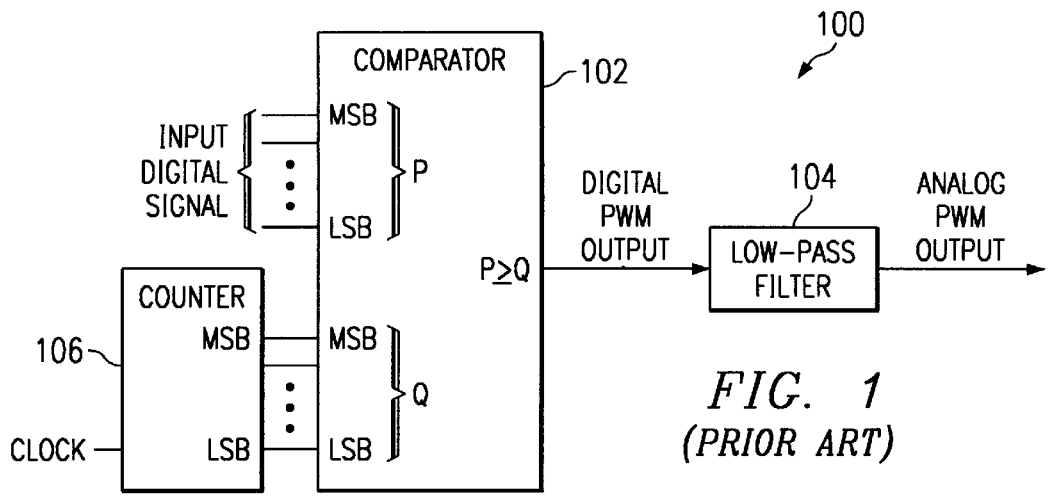
*FIG. 1*
*(PRIOR ART)*
*FIG. 2A*
*(PRIOR ART)* CLOCK
*FIG. 2B*
*(PRIOR ART)* PWM VALUE 0
*FIG. 2C*
*(PRIOR ART)* PWM VALUE 1
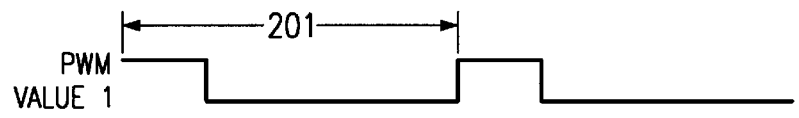
*FIG. 2D*
*(PRIOR ART)* PWM VALUE 2
*FIG. 2E*
*(PRIOR ART)* PWM VALUE 3
*FIG. 2F*
*(PRIOR ART)* PWM VALUE 4
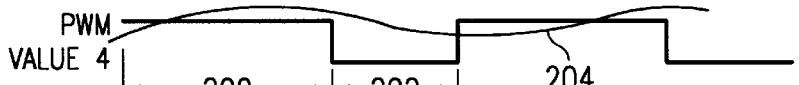
*FIG. 2G*
*(PRIOR ART)* PWM VALUE 5
*FIG. 2H*
*(PRIOR ART)* PWM VALUE 6
*FIG. 2I*
*(PRIOR ART)* PWM VALUE 7
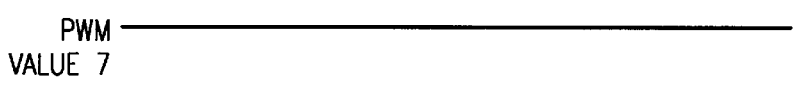

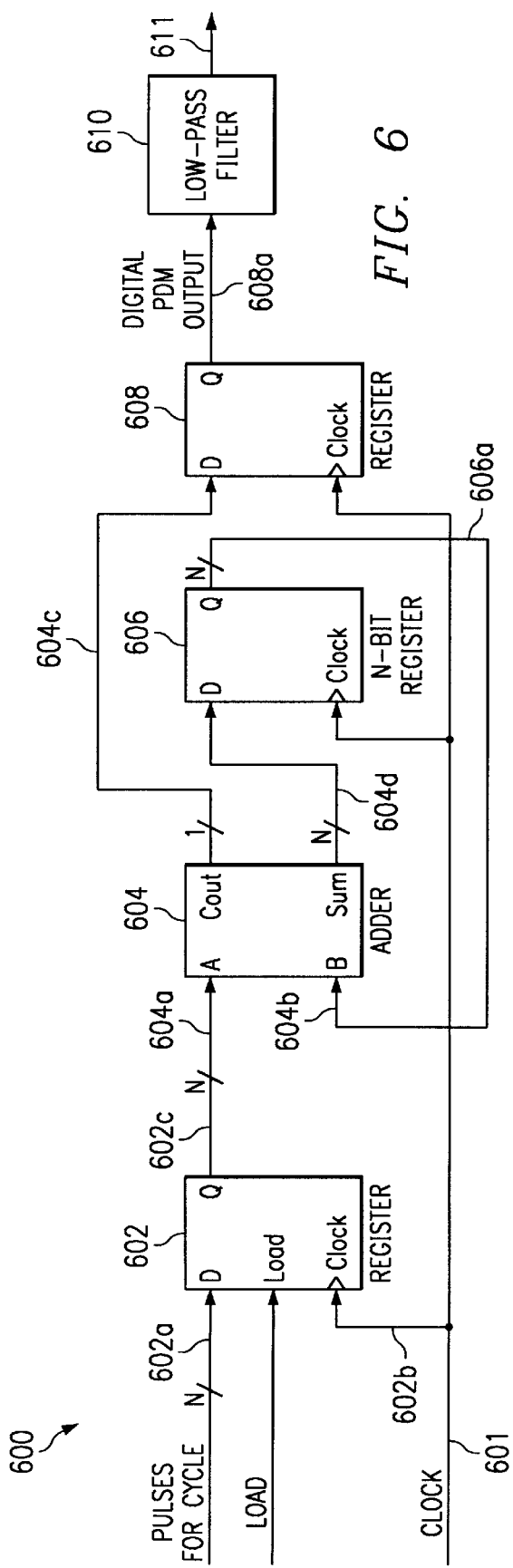
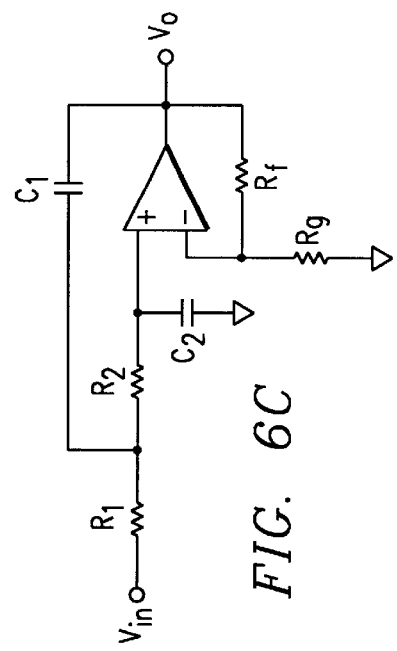
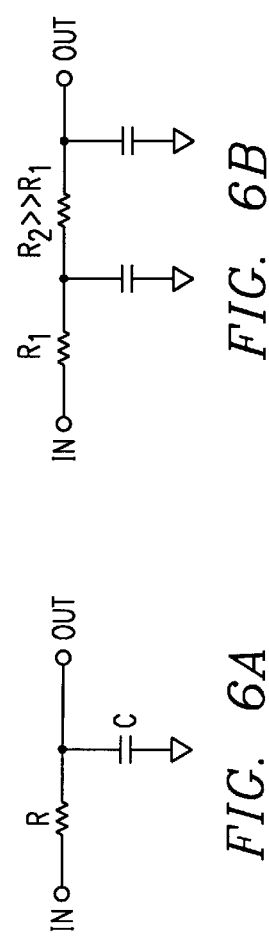
FIG. 6
FIG. 6C
FIG. 6B
FIG. 6A

FIG. 11

DIGITAL INPUT VALUE

PULSE DENSITY MODULATOR WITH IMPROVED PULSE DISTRIBUTION

CROSS-REFERENCE TO RELATED APPLICATIONS

The following applications, assigned to the assignee of the current invention, are being filed concurrently, contain material related to the subject matter of this application, and are incorporated herein by reference:

by J. McDonough, entitled "Method of and Apparatus for Generating Data Sequences for Use in Communications," Ser. No. 09/322,373, currently pending;

by D. Chen et al., entitled "Device and Method for Generating Clock Signals From a Single Reference Frequency Signal and for Synchronizing Data Signals with a Generated Clock," Ser. No. 09/322,282, currently pending;

by J. McDonough et al., entitled "Method and Apparatus for Controlling System Timing with Use of a Master Timer," Ser. No. 09/321,697, currently pending; and by J. McDonough et al., entitled "Device and Method for Maintaining Time Synchronous with a Network Master Time," Ser. No. 09/322,240, currently pending.

BACKGROUND OF THE INVENTION

1. Field of the Invention

The present invention relates to circuits such as pulse density modulators, which represent a multi-bit digital input signal with a serial binary output comprising a corresponding sequence of fixed amplitude pulses. More particularly, the invention concerns such a system that uses novel circuitry to generate a binary output with the advantage that the pulses that are evenly spaced over time.

2. Description of the Related Art

Many circuits today have need for both digital and analog circuitry. Digital circuitry provides fast computation, parallel input/output, low power, and other benefits. Analog circuitry is nonetheless useful and sometimes essential in many applications, such as transmitting electromagnetic signals, controlling motors, applying power to loads, etc. To concurrently reap the benefits of both analog and digital circuitry, some circuits employ appropriate digital-to-analog converters and analog-to-digital converters. Today's market offers digital/analog converters with many different operating theories, speeds, and other specifications.

Known digital-to-analog chips provide significant advantages, primarily in the area of speed. Nonetheless, circuit designers still lament certain features of known digital-to-analog converter chips. For example, digital-to-analog converter chips consume a significant amount of power, which can be problematic for hand-held telephones and other applications that receive limited electrical power from a compact battery. Also, when incorporated into custom-designed integrated circuits, digital-to-analog converter chips typically occupy substantial size and thereby impinge upon the circuit designer's goal of producing the smallest possible overall circuit. Digital-to-analog circuits may also be prone to defects, since analog components are represented by narrow integrated circuit etchings with unforgiving tolerances. Finally, the inclusion of a digital-to-analog converter increases the cost and complexity of the manufacturing process, which then requires one manufacturing run to lay down digital components and a separate manufacturing run to lay down analog components.

One proposed solution to the limitations of known digital-to-analog converter chips is the pulse density modulation ("PDM") circuit. Many PDM circuits operate by receiving a multi-bit parallel digital input signal, and providing a corresponding serial binary output signal. The binary, digital output signal is then treated as an analog signal, which is averaged, smoothed, or otherwise filtered. The amplitude of this analog output signal is proportional to the multi-bit parallel digital input signal, and therefore constitutes an analog representation of the digital input signal.

One known PDM circuit operates by producing a single-pulse binary signal whose duty cycle is proportional to the multi-bit parallel input signal. This PDM is said to use pulse width modulation, or "PWM." The pulse width modulated output signal is fed to a low pass filter, creating an analog output signal that is roughly proportional to the original, multi-bit digital input signal. FIG. 1 shows a circuit 100 including an exemplary pulse width modulation system that utilizes a counter 100, comparator 102, and an analog low pass filter 104. The comparator 102 compares the output of the counter 100 to a digital input. When the input is larger or equal to the output of the counter, the comparator outputs a binary "one." Otherwise, the comparators output is a binary "zero." The low pass filter 104 processes the binary output, thus creating the final analog output signal. As explained below, one drawback of this approach is that the comparators binary "one" outputs are not evenly distributed over time.

FIGS. 2B–2I show serial binary outputs corresponding to inputs of zero through seven, respectively, from a pulse width modulation system utilizing the reference clock signal of FIG. 2A. When used in this manner, pulse width modulation has certain drawbacks. Chiefly, the approach of varying the duty cycle according to input signal has the effect of lumping binary output pulses together for larger multi-bit digital input signals.

FIG. 2B shows the serial binary output corresponding to a digital input of "zero." One multi-bit binary input is represented in one output period, such as the period 201. The output of FIG. 2B represents a single output pulse, and there is no problem with signal lumping. However, FIG. 2F shows the binary output corresponding to a multi-bit parallel digital input of "four." The output signal includes a contiguous high signal 200 (binary "1"), which actually represents five output pulses together. After the high signal 200, there is a contiguous low signal 202 (binary "0"). Due to the grouping high and low signals in this way, the analog output signal exhibits overshoots. This is because, upon applying the sequential binary output signal to an analog filter, the resulting analog signal overshoots in the realm of 200, and undershoots in the realm of 202, as shown by the superimposed analog signal 204.

A variation of the foregoing circuit outputs a binary "one" when the input is strictly larger than the output of the counter. Using strictly larger instead of "greater than or equal to" results in a difference of one pulse per period. For example, a digital input of zero in a system that uses a comparator that is strictly larger than the output of the counter will not output any "ones." However, a system that uses a comparator that is "greater or equal to" zero will have one digital "one" per period. This embodiment, like the previous example, has the drawback of unevenly distributing binary "ones" in the output signal.

As shown in FIG. 3, one solution to the foregoing problems of pulse width modulation was proposed in U.S. Pat. No. 5,337,338, Sutton et al., issued on Aug. 9, 1994.

This approach uses a PDM 300 that is nearly identical to the circuit 100 of FIG. 1. The PDM 300 includes a counter 302, comparator 304, and analog low pass filter 306. However, unlike the circuit 100 (FIG. 1), the circuit 300 reverses the order of coupling 308. Namely, the mapping between most significant bits (MSBs) and least significant bits (LSBs) is swapped in the coupling between the counter 302 and the comparator 304.

FIGS. 4B–4I show serial binary outputs corresponding to inputs of zero through seven, respectively, utilizing the clock signal of FIG. 4A. A single period of the binary output is identified by 402. The purported advantage of this system is that, within a single period of the resulting serial binary output signal, like bits are not lumped together as much as the outputs of FIGS. 2B–2I. Nonetheless, as discovered by the present inventor, the output pulses are still not evenly spaced in FIGS. 4B–4I. For example, the representation of a "two" input has three "one" pulses in a period, and includes a non-symmetrical blank space 404. When filtered into an analog signal, these blank spots and lumps manifest themselves as signal overshoot. In some applications where accuracy is important, such overshoot may be unacceptable.

Thus, due to certain unsolved problems as shown above, known PDM circuits and digital-to-analog converters may not completely satisfactory for all applications.

SUMMARY OF THE INVENTION

Broadly, the present invention receives a digital input signal, either in parallel or in series, and translates this signal into a serial binary output signal with pulses that are evenly distributed over time. The resulting binary signal may be passed to a low pa s filter, resulting in an analog signal representative of the original digital input.

The invention includes a PDM including an accumulator that receives a digital input signal representing an integer digital input value. The PDM produces a serial binary output signal where the number of pulses vary in proportion to the magnitude of the digital input value. The accumulator includes an input and a carry output. For each digital input signal, the accumulator repeatedly computes a current N-bit sum value by adding the digital input signal with a last-computed version of the sum value. According to this computation, the accumulator either (1) provides a first prescribed signal on the carry output if the current sum value cannot be expressed in N bits, or (2) provides a different prescribed signal on the carry output if the current sum value can be expressed in N bits. The carry output provides a serial binary output signal having $2^N$ bits in each "period" or "cycle." The accumulator may be used as a digital-to-analog converter by routing the carry output to an analog filter. Alternatively, the digital output of the accumulator may be used to provide a repeating, evenly spaced event trigger signal. One example is a hardware interrupt signal.

In one embodiment, the invention may be implemented to provide a method, such as a method of converting digital input signals to analog signals, or a method of representing digital input signals as serial binary output signals with pulses that are optimized as to their even distribution over-time. In another embodiment, the invention may be implemented to provide an apparatus such a digital-to-analog converter, or more broadly, a PDM circuit.

The invention affords its users with a number of distinct advantages. For example, the invention provides output pulses that are more evenly spaced over time, and therefore exhibit less overshoot when low-pass filtered. Such filtered signals more accurately represent their corresponding digital input signals because the even distribution of the output pulses ensures that the low pass filter's output deviates little from the desired analog value. Furthermore, due to the more evenly distributed output pulses, the low pass filter may be a low order filter, such as a first order filter, which provides a faster response than higher order filters. Lower order filters also offer the advantages of being small, cost-effective, and convenient to implement. Beneficially, since the analog filter may be provided separately from the PDM chip, the present invention avoids the expensive process of conducting digital and analog process runs on a single chip. Furthermore, aside from digital-to-analog conversion, the evenly spaced unfiltered binary signals generated by the invention may be selectively adjusted in period to provide periodic trigger signals such as hardware interrupts, etc. As another advantage, the present invention achieves a smaller and less complicated PDM by replacing comparator of previous approaches with an accumulator. The invention also provides a number of other advantages and benefits, which should be apparent from the following description of the invention.

BRIEF DESCRIPTION OF THE DRAWINGS

FIG. 1 is a block diagram showing a known pulse width modula on circuit.

FIG. 2A is a diagram showing a clock signal used to generate the pulse width modulated signals of FIGS. 2B–2I, as known in the art.

FIGS. 2B–2I are diagrams showing output signals from the known pulse width modulation circuit of FIG. 1, according to the prior art.

FIG. 6 is a block diagram showing a specific implementation of PDM circuit as a digital-to-analog converter according to the invention.

FIG. 6A is a schematic diagram of an illustrative passive first order filter, according to the invention.

FIG. 6B is a schematic diagram of an illustrative passive second order filter, according to the invention.

FIG. 6C is a schematic diagram of an illustrative active filter, according to the invention.

FIG. 11 is a diagram showing sixteen-bit, N=4 output signals produced by the PDM of the invention in response to various digital input values and illustrated register states.

DETAILED DESCRIPTION

The nature, objectives, and advantages of the invention will become more apparent to those skilled in the art after considering the following detailed description in connection with the accompanying drawings. As mentioned above, the invention concerns a PDM that represents a digital input signal with a serial binary output comprising a representative sequence of fixed amplitude pulses, where these pulses are optimized as to their even distribution over time.

Hardware Components & Interconnections
General Description: Pulse Density Modulator (PDM)

One aspect of the invention concerns a pulse density modulator ("PDM"), which may be embodied by various circuitry. Depending upon the particular requirements of the application in the areas of speed, expense, tooling costs, and the like, this circuitry may be implemented in an application specific integrated circuit ("ASIC") having thousands of tiny integrated transistors. Such an ASIC may implemented using CMOS, TTL, VLSI, or another suitable construction. Other alternatives include a digital signal processing chip ("DSP"), discrete circuitry (such as resistors, capacitors, diodes, inductors, and transistors), field programmable gate array ("FPGA"), programmable logic array ("PLA"), and the like.

Figure 3:
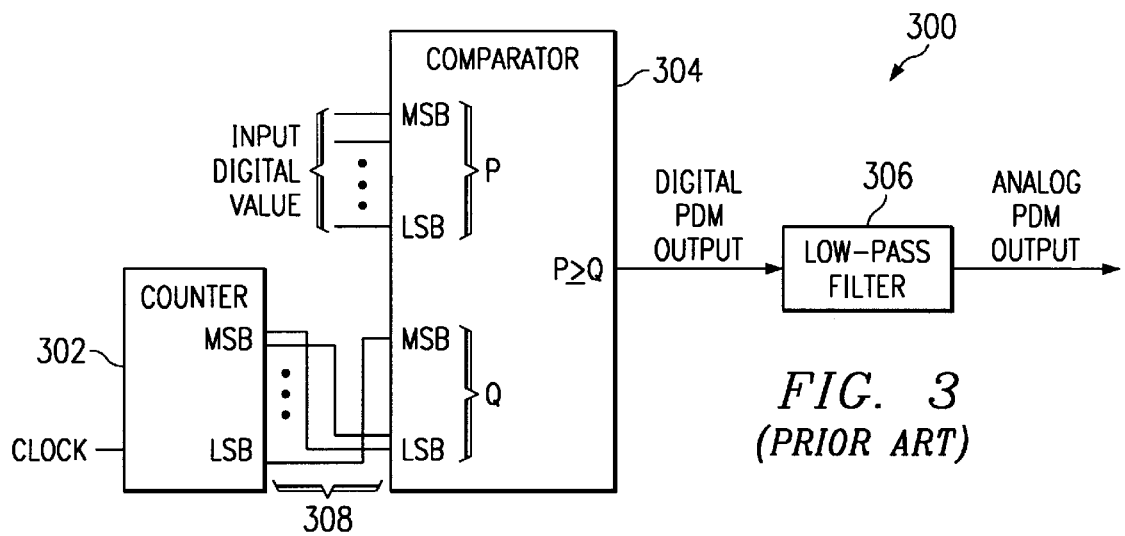
FIG. 3 is a block diagram showing a known PDM constructed by slightly modifying the pulse width modulation circuit FIG. 1.
Figure 4A:
FIG. 4A is a diagram showing a clock signal used to generate the pulse width modulated signals of FIGS. 4B–4I, as known in the art.
Figure 4B:
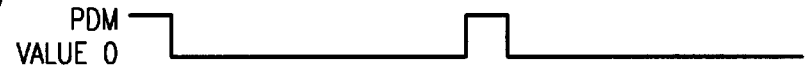
FIGS. 4B–4I are diagrams showing representative output signals from the PDM of FIG. 3, according to the prior art.
Figure 4C:
Figure 4D:
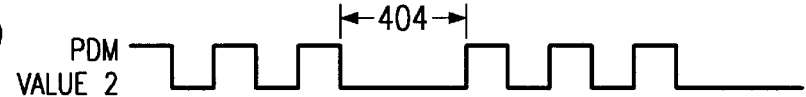
Figure 4E:
Figure 4F:
Figure 4G:
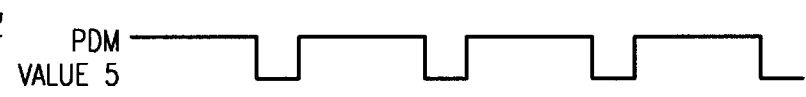
Figure 4H:
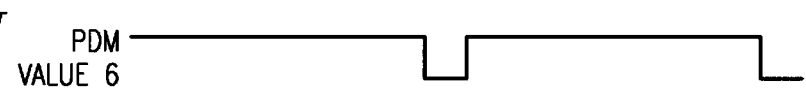
Figure 4I:
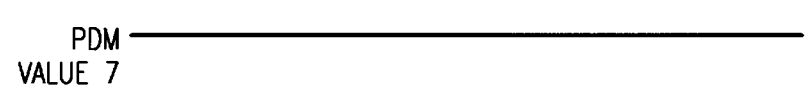
Figure 5:
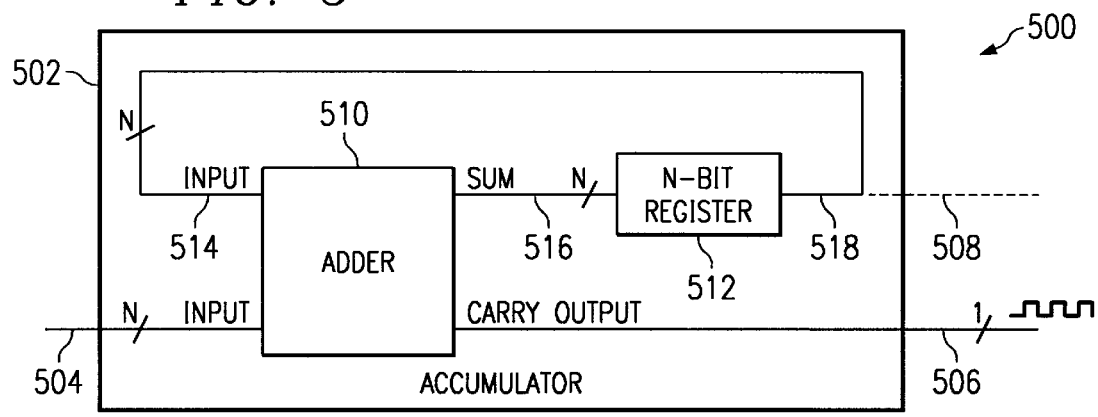
FIG. 5 is a block diagram showing the hardware components and interconnections of a PDM circuit of the invention.

FIG. 5 shows the hardware components and interconnections of an exemplary PDM 500. The PDM 500 is implemented by an accumulator 502, which has an input line 504 to receive a digital input signal. In the illustrated embodiment, the input line 504 receives the digital input bits in parallel, although a serial input may be used instead. The input line 504 comprises one or more busses, wires, fiber optic lines, cables, or other suitable means to receive a digital input signal. Although receipt of the input signal may be serial or parallel depending on the particular application, the present illustration discusses a parallel, multi-bit binary input as one example. As illustrated, the input bits are "N" in number and the input line 504 is therefore called an "N-bit" input line. Stated in another way, the "width" of the input line 504 is said to be "N". Each input signal represents a digital input value such inters from zero to $2^N-1$ (i.e., binary 000, 001 ... 111). As a specific example, the number "N" may be three. The accumulator also has a carry output 506, which provides a single bit, sequential binary output signal, which may be called a "carry output signal" and is discussed further below. Although not necessary for this invention, the accumulator may provide a sum output 508 that contains an N-bit sum computed by the accumulator 502, as discussed in detail below.

In an alternative embodiment (not shown), the input may have less than "N" bits. This approach recognizes that the full range on the output PDM will not be available. This may be useful, for example, in operating the PDM 500 as a trigger, where the input is unlikely to be at the "high" end of the PDM, e.g., binary "111." In another embodiment (not shown), the digital input and register may occupy N+1 bits, where the PDM generates the carry output bit in response to detecting any change in the highest order bit.

Referring to FIG. 5, the accumulator 502 repeatedly sums the digital input value (represented by the signal on the input line 504) with the last such sum to compute a current sum. If equipped with the optional N-bit sum output 508, the accumulator 502 represents the current sum on the output 508. More importantly, the carry output 506 presents a single-bit binary output according to whether the adder 5110 has experienced an overflow condition. The carry output 506 provides one prescribed binary signal (such as a binary "one") if the entire sum can be expressed in N bits (i.e., overflow condition). The carry output 506 presets a different binary prescribed signal (such as a binary "zero") if the current sum can be expressed in N bits (i.e., no overflow).

The present inventor has taken the novel approach of treating the carry output itself as a standalone source of data, independent of any sum output. Namely, the carry output 506 provides a series binary signal. As mentioned above, the digital input value has N-bits. In the carry output signal, the current digital input value is represented by the number of pulses occurring in a span of $2^N$ successive carry output bits. For example, when the number of bits "N" equals three, a digital input value of three (i.e., binary 011) is represented by a binary output sequence having three pulses (binary "1" signals) that occur during each repeating cycle of eight ($2^N$) bits. Unlike previous circuits, the present invention optimizes the time-spacing of the pulses, thereby avoiding isolated lumps of binary ones and lengthy spaces of binary zeros whenever possible. As another advantage, the present invention achieves a smaller and less complicated PDM by replacing comparator of previous approaches with an accumulator, such as the accumulator 502.

Without any intended limitation, FIG. 5 shows an exemplary construction for the accumulator 502. Subcomponents of the illustrated accumulator include an adder 510 and a register 512. The adder 510 includes two input lines, including the input line 504 and another input line 514. The adder 510 serves to sum the signals on the input lines 504, 514 and provide a representative N-bit binary sum on the sum output line 516. The adder circuit 510 has a carry output line, which coincides with the carry output line 506.

The sum output line 516 is coupled to the register 512, which samples the current sum on the line 516, temporarily stores this signal, and provides a more lasting representation of the sum on the line 518. The register 512 provides the sum output as feedback to the adder 510. Although the adder 510 need not be clocked, the register 512 operates according to a clock signal (not shown) and may comprise a flip-flop or other suitable signal storage device.

Digital-to-Analog Converter

One application of the present invention's PDM is to convert digital input signals into analog output signals. FIG. 6 shows the hardware components and interconnections of an exemplary digital-to-analog converter circuit 600. In addition to providing the digital-to-analog converter function by addition of the analog filter 610, this circuitry also serves to illustrate one more specific implementation of the PDM 500. The digital portions of the circuit 600 may be implemented in similar circuitry as discussed above in the context of the PDM 500, such as an ASIC, discrete circuitry, FPGA, PLA, etc.

The circuit 600 includes an N-bit input register 602, an N-bit adder 604, an N-bit hold register 606, an output register 608, and an analog low-pass filter 610. The register 602 receives an N-bit binary input signal on an N-bit input line 602a, and also receives a clock 601 on a line 602b. As synchronized by the clock signal, the register 602 presents the input signal to the adder 604 on an N-bit output line 602c. Although the illustrated clock 601 is common to various circuits, separate clocks may be used if desired.

The adder 604 includes an input line 604a that is connected to the register's output 602c. The adder 604 is coupled to an output 606a of the second register 606, as discussed below. In the illustrated example, the adder 604 is not clocked, and serves to asynchronously compute the sum of the inputs on the lines 604a, 604b. The adder 604 presents the resultant sum on an N-bit sum output line 604d; this value is called the "present" or "current sum. Concurrently with presentation of the sum, the adder 604 also presents a corresponding carry output on a carry output line 604c. The carry output comprises a binary "one" if the computed sum cannot be expressed in N bits, and a binary "zero" if the computed sum can be expressed in N bits. The foregoing use of binary ones and zeros may be reversed if desired, without departing from the scope of this invention.

The adder 604 presents its computed sum to the N-bit register 606, which operates according to the clock signal 601. The register 606 serves the useful purpose of storing the sum for use by the next add operation. The register 606 provides the stored sum as feedback to the input 604b of the adder 604 via the line 606a. Other than internally providing the sum back to the adder 604, the computed sum is not a necessary output of the circuit 600 and may be disregarded.

The adder 604 provides its carry output signal to the register 608, which operates according to clock signal 601. The register 608 serves to sample and store the carry output signal, and provide a representation of the stored carry output signal upon a line 608a. The register 608 also samples the carry output for another reason, namely to account for the fact that asynchronous adders can exhibit glitches on their outputs. Alternatively, glitches may be avoided by clocking the adder 604, in which case the register 608 may be omitted. Since the register 608 need only handle a single bit to process the single bit carry output signal, the register 608 may be economically implemented with a flip-flop. The output of the register 610 is a sequential binary signal. Each digital input signal is represented by the number of pulses occurring in a span of $2^N$ successive bits of carry output bits. For example, where the number of bits in each sum is three (N=3), a digital input value of three is input as binary "011"; this input value is represented by a binary output sequence having three evenly spaced binary ones ("pulses") occurring in each repeating cycle of eight ($2^N$) bits. This output sequence is illustrated in greater detail below. Advantageously, the present invention optimizes the time-spacing of the pulses, thereby avoiding isolated lumps of binary ones and lengthy spaces of binary zeros wherever possible.

The register 608 provides its output 608a to the low pass filter 610. The filter 610 comprises an analog filter configured to smooth the binary output sequence provided by the carry output. As an example, where the clock signal has a frequency of 20 MHz, the low pass filter 610 may exhibit a passband from about 160 kHz and lower. Continuing with the foregoing example, the filter 610 may comprise a first order filler such as an R-C circuit (FIG. 6A), where the R is 10 kohms and C is 0.1 $\mu$F. Alternatively, a filter of second order (FIG. 6B) or greater may be used. Ordinarily skilled artisans (having the benefit of this disclosure) will recognize that a variety of different filtering techniques may be used, including both active and passive filters. FIG. 6C shows one example of an active filter.

The filter 610 may provide a final stage of the digital-to-analog converter 600, since the filter 610 provides an analog output signal (on line 611) that represents the digital input value. The magnitude of this analog signal is proportional to the digital input signal, for the following reasons. In a three bit system (N=3), the maximum digital input value of seven (binary "111") results in a carry output having seven pulses. If system power is five volts, the filtered output 611 will be maximized; this voltage will equal system voltage multiplied by the digital input divided by $2^N$ (or in this case 5 volts×⅞=4.375 volts). This voltage signifies a digital input of useven." In contrast, the minimum digital input signal of zero (binary "000") results in a carry output having no pulses. Accordingly, the corresponding filtered output 611 is zero volts; this voltage, then, signifies a digital input of "zero." Each digital input between one and seven is represented by an intermediate, proportional filtered output voltage (at line 611).

Advantageously, in the carry output 608 the spacing of the binary ones (pulses) over time is optimized. Consequently, the filtered output 611 exhibits significantly less overshoot, and therefore more accurately represents the digital input values.

Ripple Carry Adder

Figure 7:
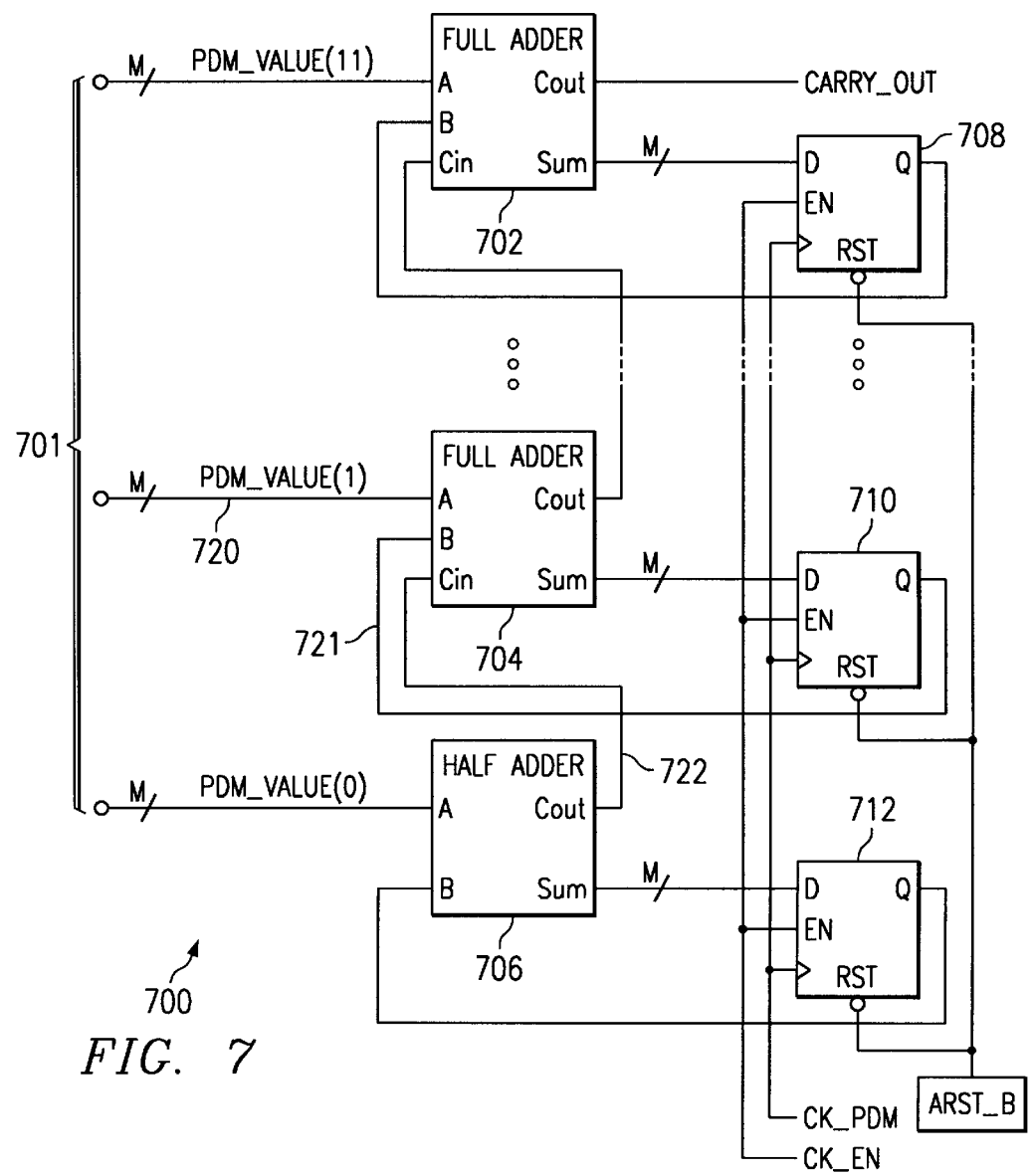
FIG. 7 is a block diagram showing an illustrative PDM circuit of the invention, which is implemented with a ripple carry adder.

FIG. 7 shows a PDM 700 that utilizes a different construction, implementing a ripple carry adder. Ordinarily skilled artisans (having the benefit of this disclosure) will recognize other ways to implement adders and/or accumulators in addition to this specific example.

The ripple carry adder enables construction of a PDM capable of processing N-bit digital input signals with many smaller adders, each having a width "M" that is less than N. Although each adder is incapable of processing the expected range of digital input signals alone, the adders can cooperatively rise to the occasion. This is achieved by using a chain of M-bit accumulators with their carry outputs daisy-chained from one accumulator to the next. Although the carry outputs are used in this manner internally, the external output of the PDM only utilizes the carry output of the hierarchically highest accumulator. This signal constitutes the PDM's sequential binary output, which represents the digital input value.

The PDM 700 may be implemented with similar circuitry as discussed in other embodiments above, such as ASIC, discrete circuitry, FPGA, PLA, etc. The PDM 700 includes a hierarchical array of adders, where each adder is coupled to a corresponding M-bit memory register to cooperatively form an accumulator. For example, adders 702, 704, and 706 are shown in hierarchical order from top to bottom, each adder coupled to respective M-bit registers 708, 710, 712. Except for the bottom-most register 706, the remaining adders are "full adders," which sum first, second, and third input signals. Using the adder 704 as an example, the first input line 720 receives M bits of the digital input signal. The second input line 721 receives the M-bit sum that was previously computed by that accumulator, as provided by the corresponding register 710. The third input line 722 receives the one-bit carry output signal from the hierarchically next-lower adder 706. The hierarchically lowest adder 706 may be a "half-adder" instead of a full adder, computing its sum from two inputs rather than three. The third input line is unnecessary because the last adder 706 does not receive any carry output from a hierarchically lower adder.

More Detailed Implementation With Enhanced Features

Introduction

Figure 8:
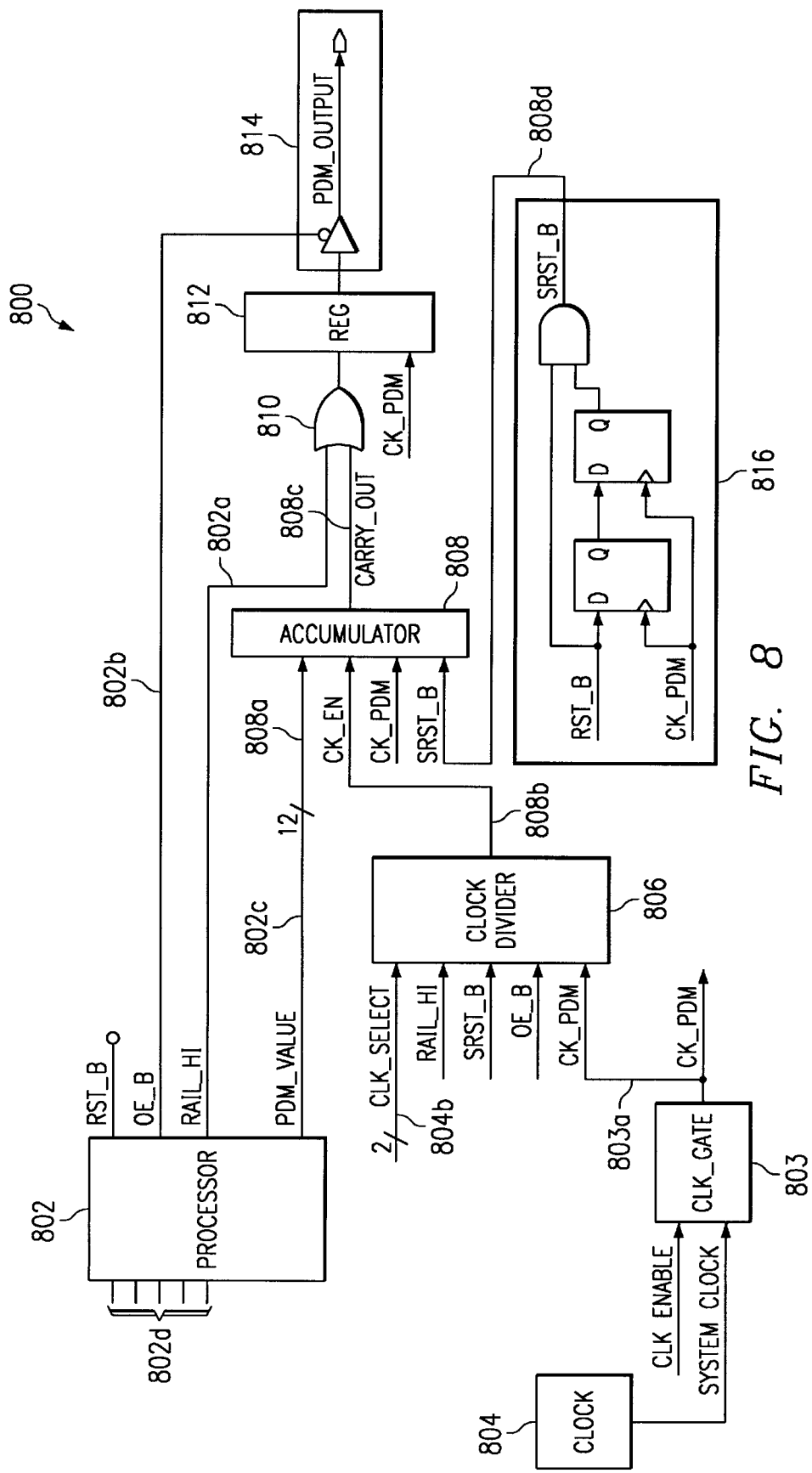
FIG. 8 is a block diagram showing a PDM circuit with supplementary features such as a clock divider, OR gate, reset circuit, and output enable selector, according to the invention.

FIG. 8 shows a more detailed embodiment of PDM 800, with several additional enhancements. Some enhancements include a clock divider, reset circuit, OR gate, and output enable circuit, as discussed in greater detail below. The PDM 800 may be implemented using similar circuitry as discussed in other embodiments above, such as an ASIC, discrete circuitry, FPGA, PLA, etc. The PDM 800 includes a processor 802, clock 804, clock gate 803, clock divider 806, accumulator 808, OR gate 810, output register 812, output enable circuit 814, and reset circuit 816.

Clock, Gate, and Divider

The clock 804 provides a digital clock signal for all clocked circuits in the POM 800, including the accumulator 808. The clock 804 provides its clock signal to a clock gate 803, then to the clock divider 806 over a line 803a. The clock gate 804 provides the ability to disable the clock on the PDM to conserve power, which may be desirable in certain modes. The clock divider 806 facilitates division of the clock signal into lower frequency signals to conserve power. The clock divider 806 receives the input clock signal and divides this signal by a divisor represented by a signal on the line 804b. The clock divider 806 provides the reduced frequency clock signal to the accumulator 808 on a line 808b.

Digital Signal Processor

The processor 802 comprises a circuit that receives various digital input signals and provides output signals whose value and timing are determined according to certain instructions, programming, or other configuration of the processor. As one example, the processor 802 may be implemented by a digital signal processor circuit. In one implementation, the processor 802 may also include a processor interface (not shown). One function of the processor 802 is providing a multi-bit parallel binary input signal on a line 802c, which is coupled to the digital signal input line 808a of the accumulator 808. As described herein, the accumulator 808 converts this digital input value into a binary serial output signal having output pulses that are optimized as to their even distribution over time. The processor 802 also generates an output enable ("OE") signal on an output enable line 802b, for use by the output enable circuit 814 as discussed below. In addition, the processor 802 can selectively send a binary "one" to the OR gate 810 over a line 802a, for the reasons discussed below. The processor 802 may also be programmed to perform other useful functions, broadly described as control and/or control loop functions of the circuitry 800 and other circuitry (not shown). The processor 802 includes various inputs 802d, and operates according to instructions contained in flash memory, EPROM, ROM, RAM, or other memory source (not shown).

Accumulator & Reset Circuit

In addition to the clock line 808b and digital input line 808a discussed above, the accumulator 808 includes a carry output line 808c. The accumulator 808 operates in similar fashion to the PDMs discussed above, and may include a similar subcomponents such as sum output line, adder, and one or more registers, which are omitted from the present illustration for ease of illustration. The accumulator 808 provides its carry output signal upon the carry output line 808c.

The accumulator 808 may additionally include a reset line 808d, coupled to a reset circuit 816. When the reset circuit 816 is activated by the processor 802, the circuit 816 triggers the reset line 808d, causing the accumulator 808 to reset. Resetting of the accumulator 808 has the effect of setting the accumulator's sum computation and carry output to zero. This feature may be used to correct the accumulator in case it has powered up in an unstable state, or prevent such an occurrence. The reset circuitry is also useful for simulations and manufacturing testing.

OR Gate

The carry output line 808c is coupled to an OR gate 810. The OR gate 810 additionally receives a signal from the line 802a of the processor 802, and performs a logical OR operation on these two single bit binary signals to alter the carry output under certain circumstances. As explained below, this may be useful to represent one additional digital signal input bit by creating a serial binary output of all ones.

Register

The OR gate 810 is coupled to the register 812. The register 812 may be implemented with a single-bit register, such as a flip-flop, which operates in accordance with the clock 804. The register 812 samples and holds the carry output arising from the accumulator 808 and OR gate 810, and thereby serves the purpose of aligning timing and removing glitches. Since the output of the adder may be stable at different times for different combinations of inputs, registering the carry output aligns the timing.

Output Enable Circuit

The register 812 is coupled to the output enable circuit 814, which serves to selectively deactivate the output of the register 812, which represents the carry output signal. The circuit 814 deactivates the output of the PDM 800 in response to an output enable signal from the processor 802 on the line 802b. Deactivation may be desirable to save power, de-bugging, manufacturing testing, etc.

Operation

In addition to the various hardware embodiments described above, a different aspect of the invention concerns a method for operating PDMs such as the circuits described above. More specifically, this involves the operation of converting a multi-bit digital input signal into a sequential binary output signal. In contrast to known PDMs, the present invention provides output pulses that are optimized as to their even distribution over time.

Introduction

Figure 9:
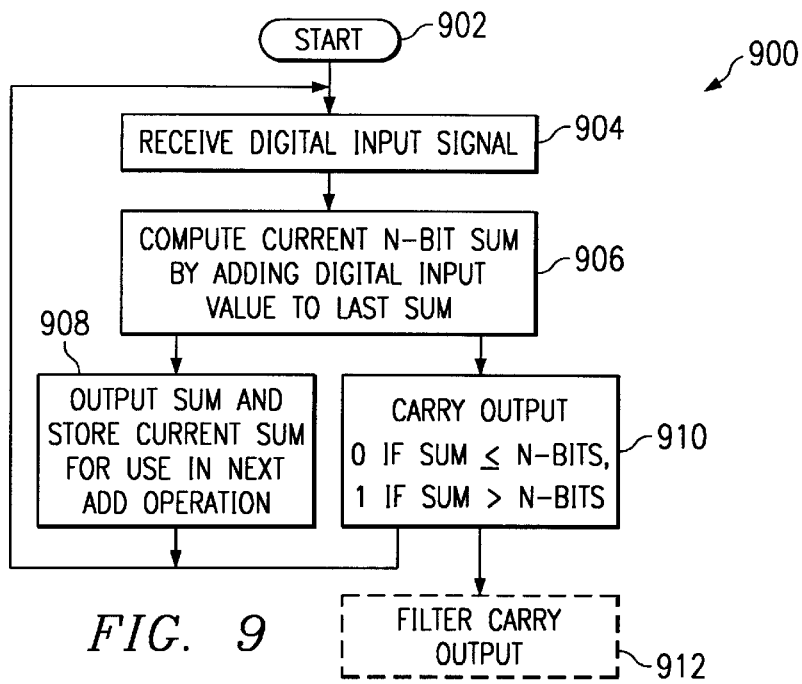
FIG. 9 is a flowchart showing an operational sequence to operate a PDM circuit to generate a serial binary output signal with evenly time-spaced output pulses, according to the invention.

FIG. 9 shows an operational sequence 900 to illustrate one example of the method aspect of the present invention. For ease of explanation, but without any intended limitation, the example of FIG. 9 is described in the context of the PDM 500 (FIG. 5) described above. The sequence 900 begins in step 902.

Receive Input Signal

In step 904, the accumulator 502 receives an N-bit parallel binary input signal on the line 504. In the illustrated example, the number of bits "N" is three. Therefore, the binary input signal can be any value from zero (binary "000") to seven (binary "111"). For the reasons described below, a digital input value of zero results in a binary output sequence having zero output pulses each cycle, a one input gives one output pulse each cycle, a two input gives two output pulses each cycle, and so on.

Compute and Store Current Sum

In step 906, the adder 510 computes a current sum by adding the digital input value (on line 504) with the last computed sum (on line 514). In step 908, the register 512 stores the current sum, and routes this signal back to the adder 510 on line 514 for use in computing the next sum. In asynchronous applications of the accumulator, the time required to compute, store, and feed the sum signal back in this manner constitutes the time of one output bit in the carry output signal.

Generate Carry Output

Concurrently with outputting of the sum in step 908, the adder 510 also provides the carry output signal on the output 506 (step 910). In the illustrated example, the carry signal includes a one-bit output that is only high when the current sum experiences an overflow condition. In other words, the carry bit appears as a binary "one" on line 516 when the current sum is too large to be expressed in N bits. Otherwise, when there is no overflow, the carry bit is low (binary "0").

Since the illustrated adder 510 operates asynchronously, the pulse width of each carry bit is determined by the operating speed of the adder 510. Namely, each carry output bit starts when one sum is computed and lasts until the next sum is computed, whereupon the carry bit is reinstated if the overflow condition does not change from one operation to the next, or the carry bit changes state if there is an overflow change.

As contemplated by the present invention, the operating speed of the adder 510 is substantially faster than speed of supplying new digital input values. Thus, after a digital input signal is provided to the adder 510, the adder 510 repeatedly outputs the desired pattern defined by its carry bits in accordance with the input signal; this continues until some time later when the digital input signal changes. As a specific example, the operating speed of the adder 510 may be about ten nanoseconds per add operation.

As an alternative to the asynchronous PDM, the accumulator may be implemented synchronously. This may be achieved, for example, by operating the accumulator synchronously, with clocked digital input values (e.g., FIG. 8). Another alternative is to operate the accumulator synchronously, where inputs to the accumulator are provided by a register that is itself clocked. In the foregoing examples of synchronous operation, the pulse width of each carry output pulse is defined by the clock signal period.

The carry output is periodic, with the same number of output pulses repeating during each output "cycle" or "period." With the illustrated hardware, the length of the output cycle is the pulse width of one carry bit multiplied by $2^N$. In a three-bit system (N=3), the output cycle has eight ($2^3$) bits.

After step 908 outputs the current sum and step 910 outputs the corresponding carry bit, these steps return to step 904 to receive a digital input signal (step 904) and recompute the sum (step 906). As discussed above, the operating cycle of the adder 510 is substantially faster than the rate at which the digital input value changes, so that the digital input value may be the same during many times when steps 908/910 loop back to step 904.

Figure 10:
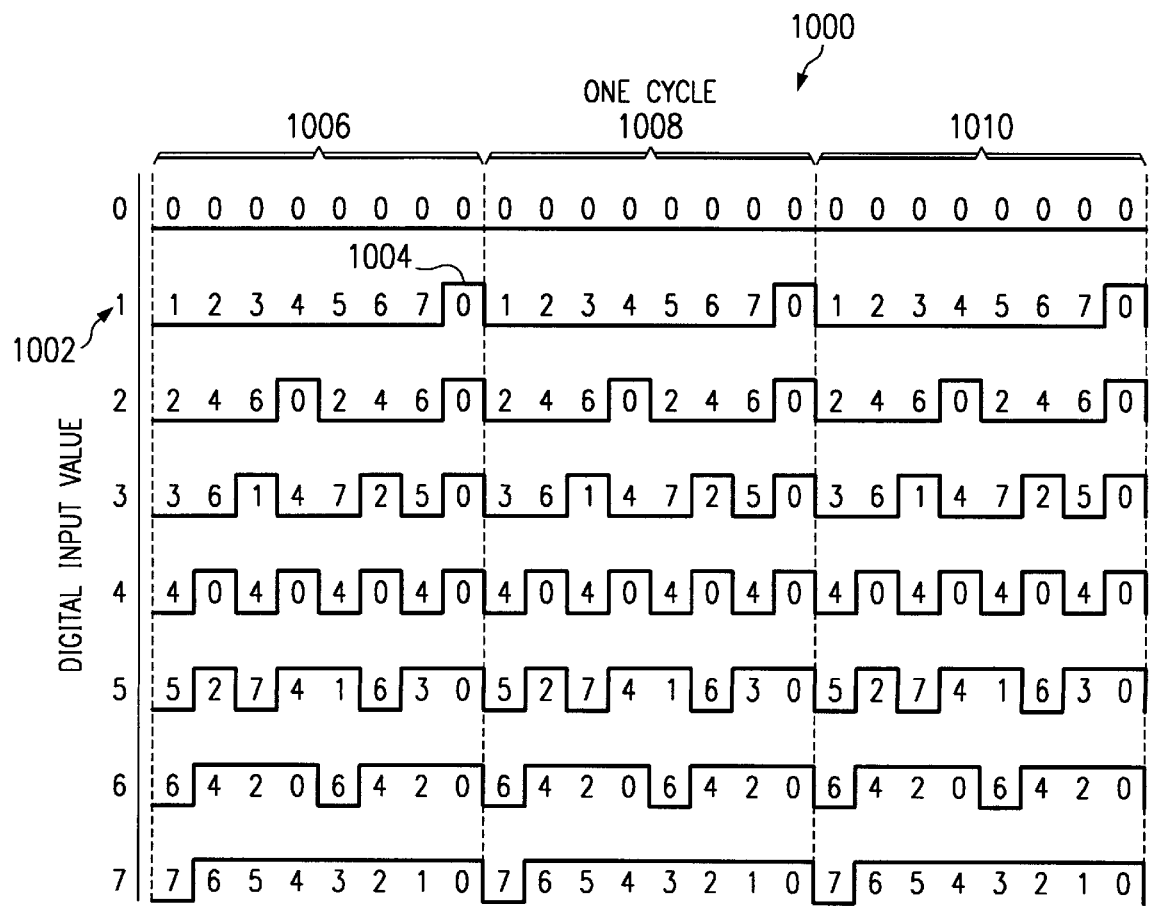
FIG. 10 is a diagram showing eight-bit, N=3 output signals produced by a PDM of the invention in response to various digital input values and illustrated register states.
Figure 11:
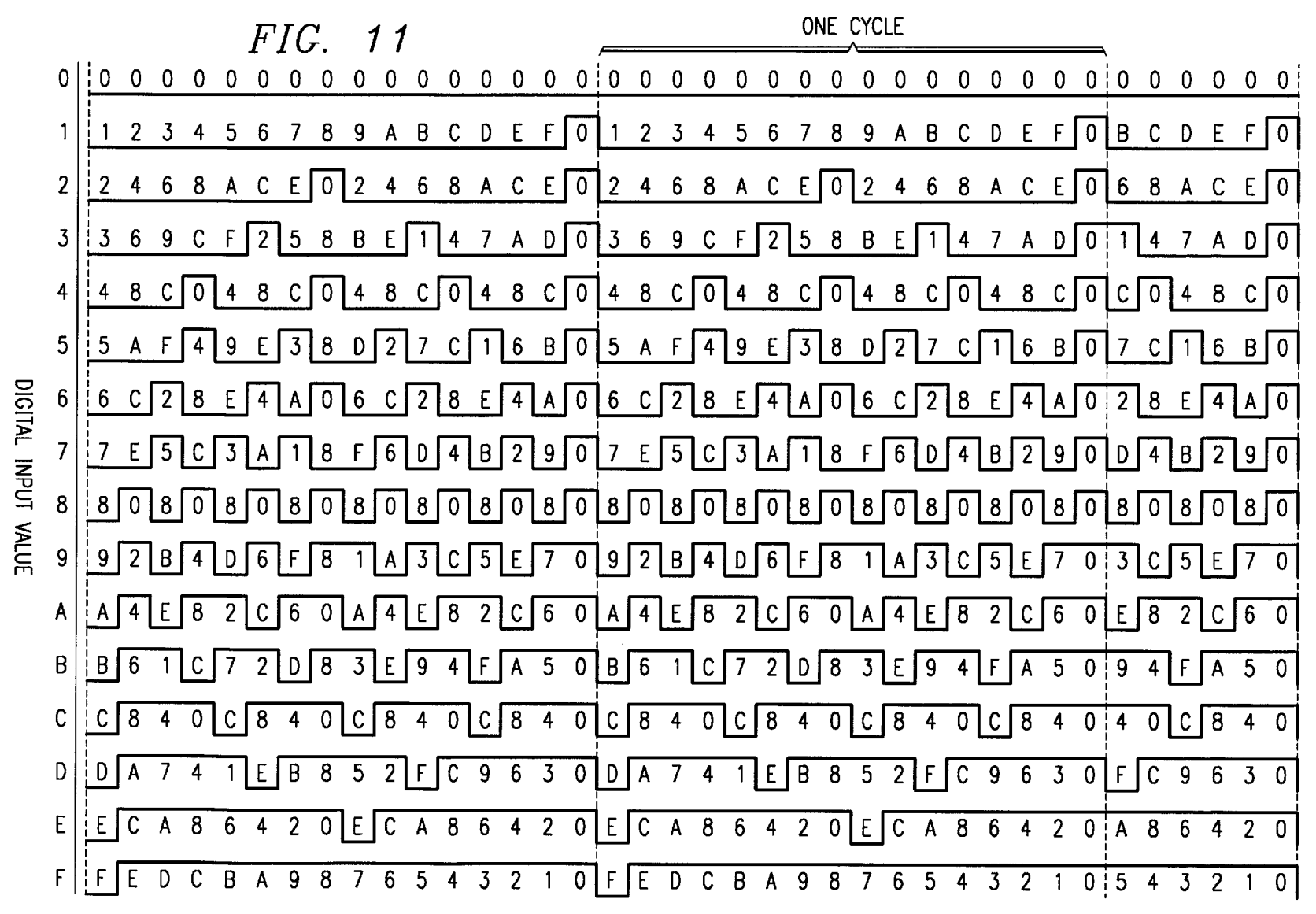

Thus, even while the digital input value does not change, the adder 510 serves to repeatedly and continually increment itself by the value of the digital input value. FIG. 10 shows an example of these computations for the PDM 500 where N=3. Each row displays successive sum computations of the adder 510, shown in respective succession from left to right. First, second, and third cycles are shown by 1006, 1008, and 1010. To discuss one example in more detail, the row 1000 shows the adder's contents for a digital input value of one (shown by 1002). As the adder successively adds one (binary "001") to itself, its contents become two, three, four, and so on. The adder finally experiences an overflow condition when the sum is eight (binary "1000") because this number cannot be expressed in three bits. At this point, the sum output becomes zero, and the overflow results in a carry bit, shown as the pulse 1004. FIG. 11 shows an expanded example representing an N=4 system.

Optional: Filter Carry Output

An optional step 912 may be performed if the PDM 500 is being used as an analog-to-digital converter. In step 912, the carry output is directed to an analog filter, such as one of the examples in FIGS. 6A–6C. Although shown after step 910, step 912 is actually performed continuously; the analog filter continuously receives the sequential, binary carry output signal, and treats it as an analog signal by applying an analog filtering algorithm. One exemplary filtering algorithm is a low pass filtering scheme, such as an R-C filter. Other filtering schemes, including both passive and active, may be used.

Alternative Application: Generating Evenly Spaced Triggers

The PDM 500 may be used in various other applications, apart from the digital-to-analog converter. For example, the PDM 500 may be employed to generate a sequence of repeating evenly spaced pulses. These pulses may be used as event triggers. For example, these pulses may be directed to additional circuitry (not shown) having a trigger line that is activated upon receipt of a trigger signal. One subset of this example includes hardware interrupt lines of a microprocessor.

To show this application in greater detail, the following example is given. The following example describes the use and configuration of the PDM 500 to satisfy the following input parameters: supplying two evenly spaced pulses occurring one second apart. Equation 1, shown below, is helpful to configure and use the PDM 500 to satisfy particular input parameters such as these.

$$T=(2^N/n)*t \qquad [1]$$

where:
T=the average time between adjacent pulses.
N=the number of bits in the parallel digital input signal.
n=the digital input value.
t=the length of one clock cycle of the adder.

In a ten bit system (N=10), where the adder 510 requires 0.02 seconds to perform a single computation (t=0.02), and one second is required between adjacent pulses (T=1), the resulting digital input value is twenty one (n=21). Accordingly, when a digital input value of twenty one is applied to the adder 510, the PDM 500 will provide evenly spaced output pulses occurring one second apart.

The 0.02 seconds required by the adder 510 to perform one computation (t=0.02) may be defined by the adder's clock cycle, if the adder is clocked. If the adder is not clocked, and therefore operates asynchronously, the computation time "t" is defined by the PDM's closed loop delay. The closed loop delay is a signal "round trip" transit time, including the time required for the adder 510 to perform one sum operation and provide the sum to the register 512, and for the register to then return this value as feedback to the input 514 of the adder 510.

Alternative Embodiment: OR Gate

As explained above in FIG. 8, the carry output may be coupled to an OR gate to condition the carry output by forcing i high under certain circumstances. The reason for forcing the carry bit high is described as follows. As shown above, PDMs can only represent N−1 bits (at most), where the digital input signal has N-bits. For example, with a three-bit digital input signal as shown in FIG. 10, a PDM can produce one, two, three, four, five, six, or seven output pulses. However, the carry output has $2^N$ bits (i.e., eight bits with a three-bit digital input signal), meaning that there is always at least one zero bit in the carry output byte.

In this example, OR gate may be used to force the carry output high and thereby represent the input value of eight (binary "1000"), which occupies one more bit than the three-bit input and would not otherwise be capable of expression with this hardware.

Other Embodiments

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

What is claimed is:

1. A method of providing a serial binary output having pulses that are optimized as to their even distribution over time, comprising operations of:

receiving an input signal representing a current digital input value on an input line having N-bits;

providing the digital input signal as input to an accumulator configured to continually update a current N-bit sum by adding the input value thereto, and in response, the accumulator repeatedly:

updating the current sum by adding the digital input value thereto;

providing an output signal successively representing each current sum;

providing a first prescribed signal on an accumulator carry output if the current sum cannot be expressed in N bits, otherwise providing a different prescribed signal on the carry output if the current sum can be expressed in N bits;

disregarding the output signal;

directing signals on the carry output to circuitry external to the accumulator; and the external circuitry allowing for up to N output pulses to be produced.

2. The method of claim 1, the input signal comprising a signal of multiple binary bits in parallel.

3. The method of claim 5, the operations further comprising:

during the repeated operations of the accumulator, sequentially providing multiple further digital input signals to the accumulator.

4. The method of claim 5, the operation of directing signals on the carry output to additional circuitry comprising:

providing signals on the carry output to an analog filter.

5. The method of claim 1, the additional circuitry comprising a processor and a logic "OR" gate, a trigger line comprising a hardware interrupt line coupling the processor and the logic "OR" gate, the logic "OR" gate having an input port for receiving the signals from the carry output and having an output port for providing the up to N output pulses.

6. A method of providing a serial binary output having pulses that are optimized as to their even distribution over time, comprising operations of:

receiving an input signal representing a current digital input value;

providing the digital input signal as input to an accumulator configured to continually update a current N-bit sum by adding the input value thereto, and in response, the accumulator repeatedly:

updating the current sum by adding the digital input value thereto;

providing an output signal successively representing each current sum;

providing a first prescribed signal on an accumulator carry output if the current sum cannot be expressed in N bits, otherwise providing a different prescribed signal on the carry output if the current sum can be expressed in N bits;

disregarding the output signal;

directing signals on the carry output to circuitry external to the accumulator;

the operation of receiving the input signal comprises receiving the input signal as a parallel, multi-bit binary signal on an input line having N bits;

the operations further comprise:

receiving a supplementary signal externally of the N-bit input line, the supplementary signal indicating an input signal having a value of $2^N$; and while the supplementary input signal is being received, continuously forcing the carry output to supply the first prescribed signal.

7. The method of claim 6, where:

the operations further comprise:

operating the accumulator to provide a sum signal representing the current sum upon a sum output; and storing the sum signal in a register;

the operation of updating the current sum comprises operating the accumulator to add the digital input signal with the sum signal from the register.

8. The method of claim 6, the first prescribed signal being a binary one.

9. The method of claim 6, where:

the operation of receiving the input signal comprises receiving the input signal as a parallel, multi-bit binary signal on an input line having N bits.

10. A method of converting digital input signals bits into representative analog signals, comprising operations of:

providing a digital input signal to an accumulator that includes an input and a carry output;

responsive to receiving the digital input signal, the accumulator repeatedly performing operations comprising:

computing a current N-bit sum by adding the digital input signal with a last-computed version of the sum; and providing a first prescribed signal on the carry output if the current sum cannot be expressed in N bits, otherwise providing a different prescribed signal on the carry output if the current sum can be expressed in N bits; and applying an analog filter to signals on the carry output to generate an analog output signal representative of the value of the digital input signal.

11. The method of claim 10, the digital input signal comprising a signal of multiple binary bits in parallel.

12. The method of claim 10, the operations further comprising:

during the repeated operations of the accumulator, sequentially providing multiple further digital input signals to the accumulator.

13. The method of claim 10, where:

the operations further comprise:

operating the accumulator to provide a sum signal representing the current sum upon a sum output; and storing the sum signal in a register; and the operation of computing a current N-bit sum comprises operating the accumulator to add the digital input signal with the sum signal from the register.

14. The method of claim 10, the first prescribed signal being a binary one.

15. A method of providing a serial binary output signal having pulses that are optimized as to their even distribution over time, comprising operations of:

receiving specification of time between adjacent pulses in a desired serial binary output;

computing a digital input value that will yield the specified time between pulses when provided as input to an accumulator configured to perform operations to continually update a current sum by adding the current input value, the operations comprising:

computing an N-bit current sum by adding a digital input signal with a last-computed version of the sum; and providing a first prescribed signal on the carry output if the current sum cannot be expressed in N bits, otherwise providing a different prescribed signal on the carry output if the current sum can be expressed in N bits; and providing the computed digital input value to the accumulator.

16. The method of claim 15, where the operation of receiving specification of time between pulses comprises receiving an specification of average time between pulses.

17. The method of claim 15, the operations further comprising:

receiving specification of a new time between pulses, and in response, repeating the computing and providing operations accordingly.

18. The method of claim 15, further comprising directing signals on the carry output to additional circuitry having a trigger line and being activated upon receipt of a trigger signal thereon.

19. The method of claim 18, the additional circuitry comprising a processor and the trigger line comprising a hardware interrupt line.

20. The method of claim 15, where:

the operations further comprise:

operating the accumulator to provide a sum signal representing the current sum upon a sum output; and storing the sum signal in a register; and the operation of computing a current sum comprises operating the accumulator to add the digital input signal with an output of the sum from the register.

21. The method of claim 12, the first prescribed signal being a binary one.

22. A method of providing a serial binary output signal having pulses that are optimized as to their even distribution over time, comprising operations of:

receiving specification of time between adjacent pulses in a desired serial binary output; computing a digital input value that will yield the specified time between pulses when provided as input to an accumulator configured to perform operations to continually update a current sum by adding the current input value, the operations comprising:

computing an N-bit current sum by adding a digital input signal with a last-computed version of the sum; and providing a first prescribed signal on the carry output if the current sum cannot be expressed in N bits, otherwise providing a different prescribed signal on the carry output if the current sum can be expressed in N bits;

providing the computed digital input value to the accumulator; and solving an equation $T=(2^N/n)*t$ for 'n', where 'T' represents the specified time between pulses, 'n' represents digital input value being computed, and 't' represents time required for the accumulator to perform one computation of a current sum.

23. The method of claim 22, where the accumulator operates according to a clock signal having a prescribed cycle, and 't' represents a length of the clock cycle.

24. A digital-to-analog converter, comprising:

an input to receive a digital input signal representing a digital input value;

a carry output; and an accumulator configured to perform operations to continually update a current N-bit sum by adding the input value thereto, the operations comprising:

receiving a digital input signal at the input;

responsive to receiving the input signal, repeatedly performing operations comprising:

updating the current sum by adding the digital input value thereto, and providing a first prescribed signal on the carry output if the current sum cannot be expressed in N bits, otherwise providing a different prescribed signal on the carry output if the current sum can be expressed in N bits; and an analog filter coupled to the carry out for producing an analog output signal representative of the value of the digital input signal.

* * * * *